United States Patent [19]
Kanebako et al.

[11] Patent Number: 5,169,797
[45] Date of Patent: Dec. 8, 1992

[54] MANUFACTURING METHOD FOR SEMICONDUCTOR STORAGE DEVICE

[75] Inventors: Kazunori Kanebako, Yokohama; Michiaki Noda, Machida; Kazushige Inagawa, Kawasaki, all of Japan

[73] Assignee: Kabushiki Kaisha Toshiba, Kawasaki, Japan

[21] Appl. No.: 750,586

[22] Filed: Aug. 28, 1991

[30] Foreign Application Priority Data

Aug. 28, 1990 [JP] Japan ................. 2-225835

[51] Int. Cl.⁵ .......................... H01L 21/70
[52] U.S. Cl. ....................... 437/48; 437/45; 437/52; 437/228; 437/235
[58] Field of Search ........ 437/45, 48, 52, 228, 437/235; 357/23.12; 365/178

[56] References Cited

U.S. PATENT DOCUMENTS

| | | | |
|---|---|---|---|
| 4,282,646 | 8/1981 | Fortino et al. | 437/48 |
| 4,295,209 | 10/1981 | Donley et al. | 365/178 |
| 4,364,165 | 12/1982 | Dickman et al. | 437/48 |
| 4,364,167 | 12/1982 | Donley | 437/48 |

FOREIGN PATENT DOCUMENTS 0148448 9/1983 Japan.

Primary Examiner—Tom Thomas
Attorney, Agent, or Firm—Foley & Lardner

[57] ABSTRACT

The present invention provides a manufacturing method for a semiconductor storage device, in which data are written by implanting impurity ions onto a channel area of a memory cell transistor, which comprises the steps of: a step for forming a gate electrode using a high melting point metal over the surface of a semiconductor substrate, and for forming an oxide film on the surface of the gate electrode; a step for forming a film on the area for forming a data confirmation pattern; and a step for forming the data confirmation pattern on the film in performing etching in the film at a high selection ratio for the above-mentioned oxide film with a mask to be used for ion implantation for ROM data.

3 Claims, 3 Drawing Sheets

MANUFACTURING METHOD FOR SEMICONDUCTOR STORAGE DEVICE

BACKGROUND OF THE INVENTION

The present invention relates to a manufacturing method for a semiconductor storage device, and in particular, relates to a suitable method for the manufacture of a mask ROM.

There is a mask ROM to which data are written by implanting impurity ions to the channel area of a memory cell transistor after it is formed. A patterned symbol is generally denoted on the surface of a semiconductor chip so that it is possible to confirm the written data.

FIG. 2 shows a plan view of such a semiconductor. In an area 15 except a memory cell array area 12, peripheral circuit areas 13 and 14 on a semiconductor chip 11 as shown in FIG. 2, a ROM data pattern is formed, and what kind of data are written on a chip 11 can be recognized by simply observing the surface of the semiconductor chip 11.

The manufacture of such a semiconductor storage device has been performed as described in the following. In FIG. 3, there are shown sectional views of elements by manufacturing processes. On the surface of a semiconductor substrate 21, a gate oxide film 22 and a gate electrode 23 are formed, and an oxide film 24 of about 200 Å thick, are formed by thermal oxidation (FIG. 3(a)). The oxide film 24 is necessary as a protection film in the case where an LDD side wall, etc. are formed in following processes.

As shown in FIG. 3(b), impurity ions are implanted in the direction of the arrows A, using a resist film 25 as a mask which is formed in the parts excluding a channel area 7. In this way, impurity ions are implanted in the channel area 7. When an N channel MOS type transistor is made to a depression type transistor, phosphor ions (P+), etc. are implanted at an accelerating voltage of 320 kV, and when it is made to an enhancement type transistor, boron ions (B+), etc. are implanted at an accelerating voltage of 160 kV.

After that, etching is performed with the use of an ammonium fluoride (NH$_4$F) solution. The purpose of the etching is to form a ROM data confirmation pattern in the area 15 shown in FIG. 2. On the surface of the area 15 a field oxide film 29 is formed as shown in FIG. 3(c-2), and etching is performed using a resist film 25 as a mask to form a pattern with a level difference. At the same time, etching is performed in the memory cell array area 12 (FIG. 2) to remove the surface of the oxide film 24 by the thickness of about 500 Å (FIG. 3(c-1)).

Next, impurity ions are implanted to form diffusion areas 31 and 32 of a source drain, and an oxide film 33 is formed on their surfaces (FIG. 3(d)). As shown in FIG. 3(c-1), an oxide film 22 in the edge portion of a gate electrode 23 is removed by etching, so that the oxide film 33 is formed.

Recently, a gate electrode is sometimes formed with a silicide of a high melting point metal such as a molybdenum (Mo) or tungsten (W), or formed in a polycide structure. This is for the purpose of lowering the resistance of the gate electrode 23 for operation at higher speeds.

When a high melting point metal is used for the gate electrode 23, after the forming of the oxide film 24 it is etched with ammonium fluoride solution, and further when after-oxidation is performed for forming the oxide film 33, the gate electrode swells to an abnormal shape like the gate electrode 34 shown in FIG. 3(e). The phenomenon is considered to be caused by the fact that the grain interfaces of the silicide are exposed by the etching of ammonium fluoride after oxidation, and not only the oxidation of the surplus silicon, but the oxidation of the high melting point metal itself is caused by after-oxidation. Because of this, when a high melting point metal is used, it has been impossible to form a ROM data confirmation pattern. There has been another problem that when the etching with ammonium fluoride is performed, not only the field oxide film 29 in the area 15 where ROM data are to be written, but the field oxide film in the memory cell array area 12 is also shaved off and a level difference is formed.

SUMMARY OF THE INVENTION

An object of the present invention is to provide a semiconductor storage device in which a ROM data confirmation pattern can be formed even when a high melting point metal is used for a gate electrode.

In the present invention, a manufacturing method of a semiconductor storage device is provided, in which a memory cell transistor is formed and impurity ions are implanted to it for the writing of data; the device comprises a step for forming a gate electrode using a high melting point metal and for forming an oxide film over the surface of the gate electrode, a step for forming a film over the area on which a data confirmation pattern is to be formed, and a step for performing etching on the film at a high selection ratio for the above-mentioned oxide film and forming the data confirmation pattern on the film using a mask to be used for ion implantation for ROM data.

In a case where a high melting point metal is used for a gate electrode for lowering the resistance of it, when etching is performed on a field oxide film with an ammonium fluoride solution for forming a data confirmation pattern and then after-oxidation is performed, the gate electrode swells to an abnormal shape, but this can be prevented if a film is previously formed over the area where a data confirmation pattern is to be formed and etching is performed on the film with a high selection ratio for the above-mentioned oxide film covering the gate electrode and the data confirmation pattern is formed using an ion implantation mask to be used for ROM data.

The area where the data confirmation pattern is to be formed is a field oxide film, and the above mentioned film to be formed over the area can be a silicon nitride film.

BRIEF DESCRIPTION OF THE DRAWINGS

In the attached drawings:

FIG. 2 is a plan view showing the plane of a semiconductor chip to which it is possible to apply a manufacturing method of a semiconductor storage device according to the present invention.

PREFERRED EMBODIMENT

Figure 1:
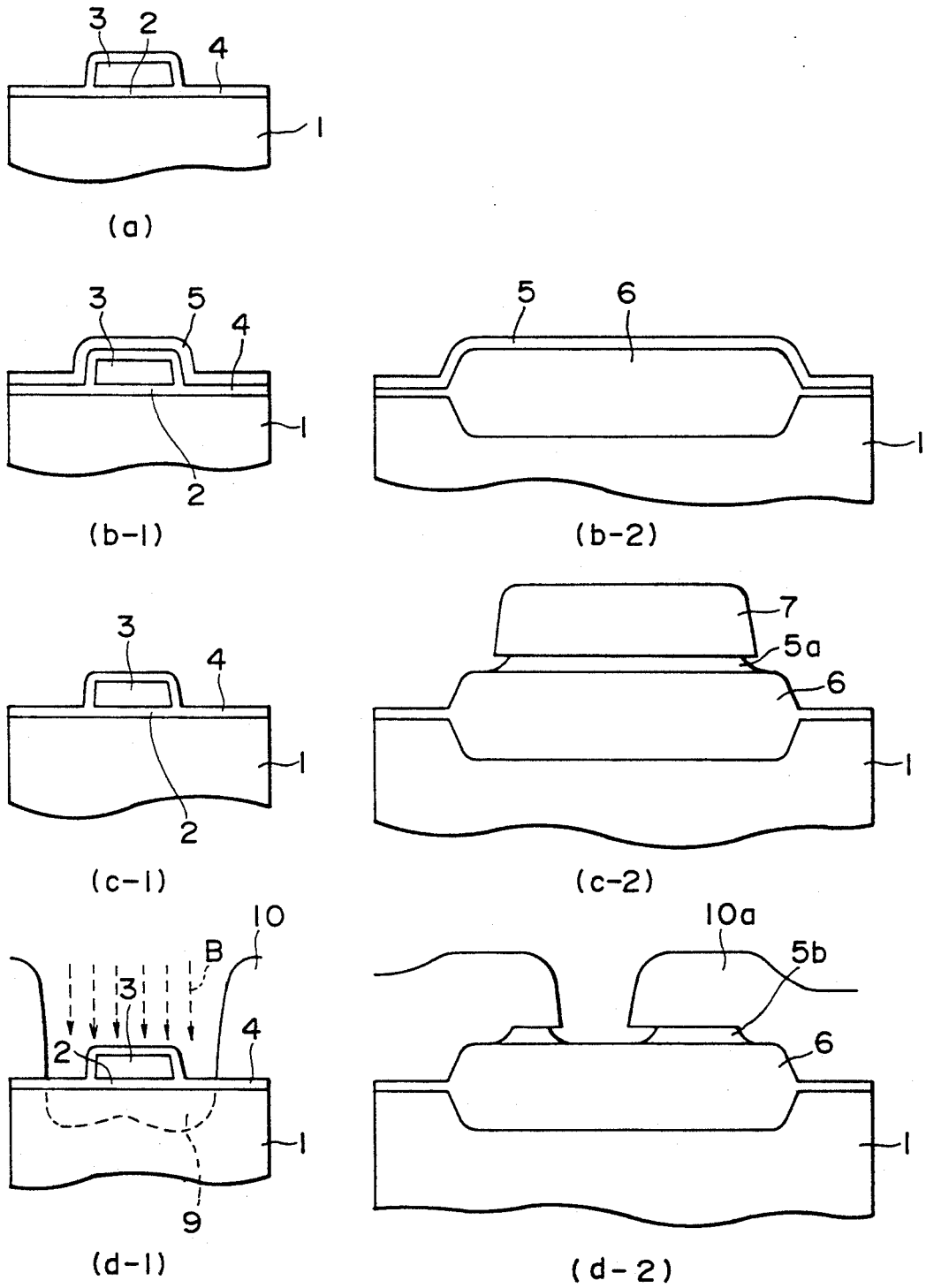
FIG. 1a–d-2 are sectional views of elements by processes showing a manufacturing method of a semiconductor storage device according to an embodiment of the present invention.
Figure 2:
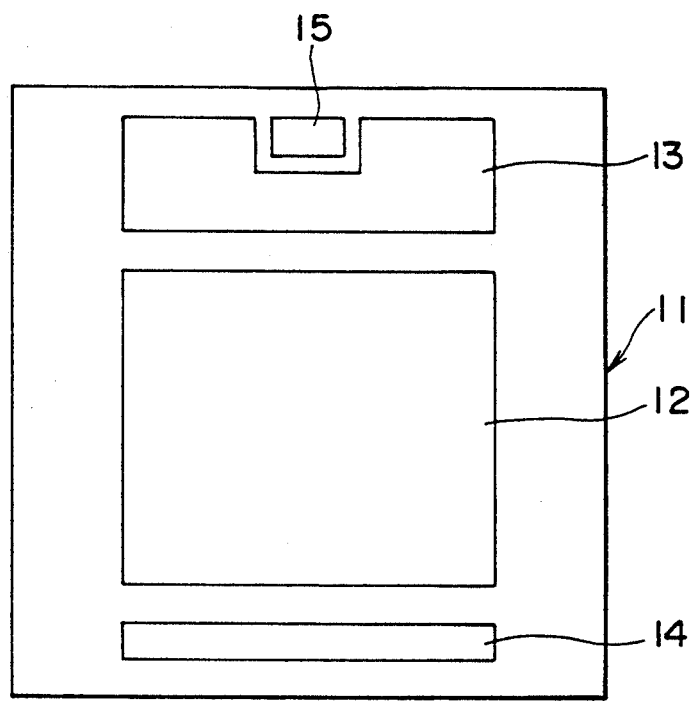
Figure 3:
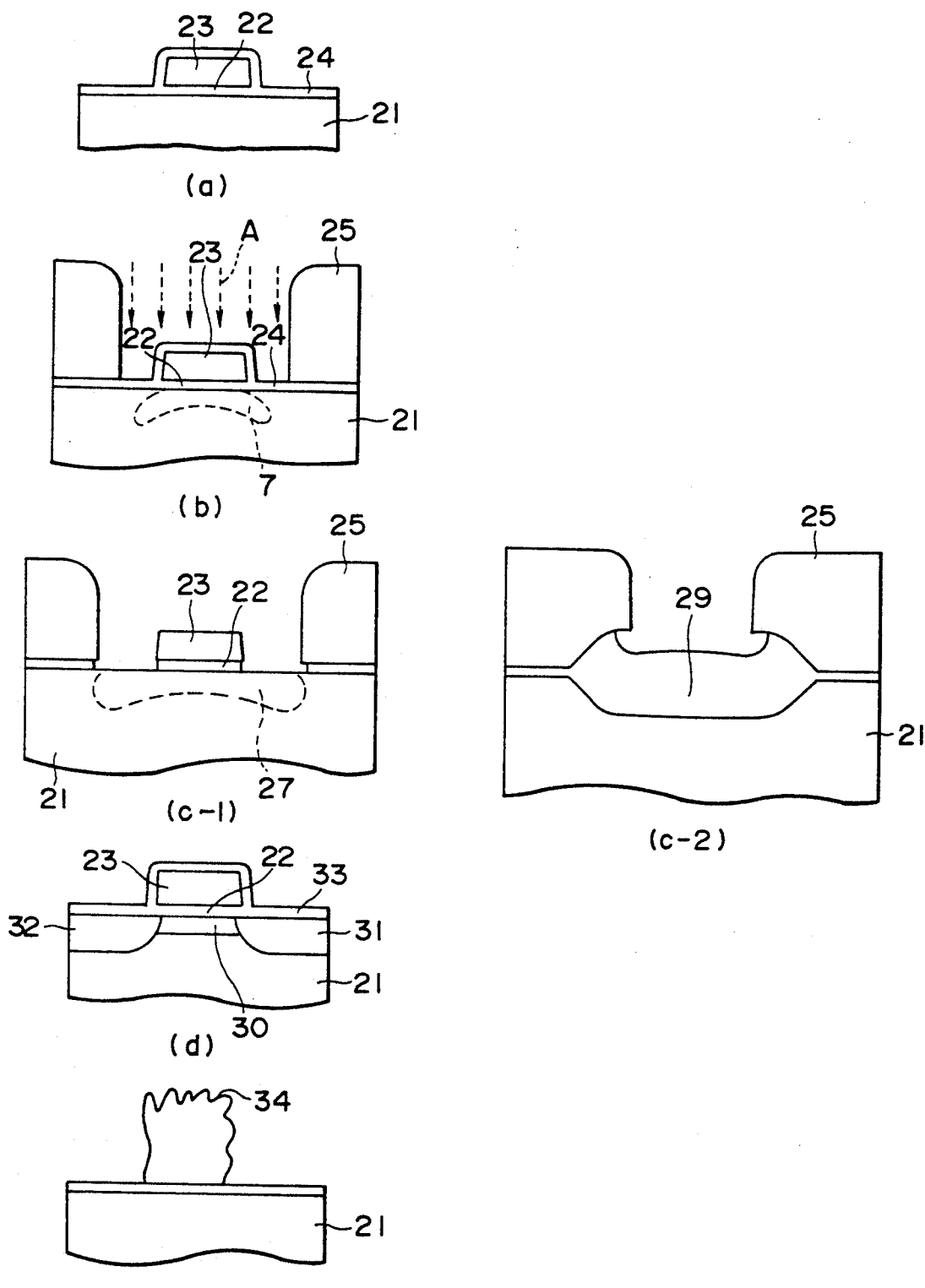
FIG. 3a to e is a sectional view of elements by processes showing a manufacturing method of a conventional semiconductor storage device.

The following is an explanation on an embodiment according to the present invention, with reference to the drawings. In FIG. 1, the manufacturing method of a semiconductor storage device according to the present embodiment is shown by processes. At first as in the case of a conventional method, an oxide film 2 of 200 Å thick is formed by thermal oxidation on the surface of a semiconductor substrate 1 and then a gate electrode 3 is formed. The gate electrode 3 is formed as shown below: for example, polycrystal silicon of about 2000 Å thick is deposited on the substrate and doped by phosphorus diffusion, and then molybdenum silicide ($MoSi_2$) of about 3000 Å thick is deposited to form a polycide structure, and it is etched to leave a desired area for forming the gate. It is oxidized in dried oxygen atmosphere of 900° C. to form an oxide film 4 (FIG. 1(a)).

A silicon nitride film 5 ($Si_3N_4$) having the thickness of between 300 Å to 500 Å, is formed over the entire surface by a low-pressure chemical vapor phase development method (LPCVD method). Thus the silicon nitride film 5 is formed to cover the gate electrode 3 in the memory cell array area 12 (FIG. 1(b-1)), and further, it is formed on the surface of the field oxide film 6 in the area 15 where a ROM data pattern is to be formed (FIG. 1(b-2)).

The silicon nitride film 5 is removed by chemical dry etching (hereinafter referred to as CDE) using a resist film 7 as a mask to leave the film only over the field oxide film 6 in the area 15 (FIG. 1) where a ROM data pattern is to be written (FIG. 1(c-1) and FIG. 1(c-2)). At this step, if lithography is to be performed, a high degree of preciseness in the overlapping of patterns is not needed and so blanket exposure without using a stepper is sufficient.

As shown in FIG. 1(d-1), a resist film 10 is formed, and with the use of the film 10 as a mask phosphor ions ($P^+$) are implanted as shown by arrows B at an accelerating voltage of 320 kV. Also, before or after the implantation of ions, with the use of a resist film 10a as a mask, a silicon nitride film 5b is scraped off to be a desired pattern by a CDE process, and ROM data are written (FIG. 1(d-2)). In the removal of the silicon nitride film 5b dry etching is performed which has a high etching selection ratio for the oxide film 4 covering the gate electrode 3, thereby the oxide film 4 can be left without being scraped off.

According to the manufacturing method in the present embodiment, a silicon nitride film which is able to have a high etching selection ratio for an oxide film is deposited over the field oxide film, and ROM data are written on the silicon nitride film. Therefore, there is no need to write ROM data on a field oxide film with ammonium fluoride solution or to perform post-oxidation, so that the occurrence of abnormal oxidation is prevented even when a high melting point metal is used for a gate electrode. Because of this, even in the case where a high melting point metal is used for a gate electrode to speed up the operation, a ROM data confirmation pattern can be formed.

Even when additional oxidation is performed after ROM data are written on the silicon nitride film 5b, abnormal oxidation does not occur because the gate electrode 3 is covered with an oxide film 4.

In the manufacturing method of the present embodiment, the accelerating voltage to be applied when impurity ions are implanted for writing ROM data can be the same level as that in the conventional case, and no special device is needed. Further, the damage or the dispersion which follows ion implantation is also in the same level as that in the conventional case. When both cases are compared on the turnaround time (TAT), in the case of the embodiment a process for forming a silicon nitride film has to be added to the processes in a conventional case (FIG. 1(b-1) and (b-2)), however there is no need to perform the process of etching with ammonium fluoride solution and the process of post-oxidation, and in the result TAT in the case of the embodiment is equal or less than that in the case of a conventional device.

When the etching is performed with ammonium fluoride solution as in a conventional case, not only the field oxide film in the area 15 where ROM data are to be written but also the field oxide film in the memory cell array area 12 are scraped off and a level difference is caused. However, according to the present embodiment such a situation can be avoided.

The above-mentioned embodiment is an example and it does not limit the scope of the present invention. For example, in the embodiment, a silicon nitride film 5 is formed over the field oxide film to write a ROM data pattern, however the film can be of other materials, for example, polycrystalline silicon film, etc. can be used if the film has a high selection ratio in etching for the silicon oxide film and dry etching can be performed for the film.

What is claimed is:

1. A manufacturing method for a semiconductor storage device to be written data by implanting impurity ions onto channel regions of transistors in an area of memory cells, comprising the steps of:

forming gate electrodes using a high melting point metal in the area of memory cells, and forming an oxide film over the surface of said gate electrodes;

forming a film over the surface in the area of memory cells and an area for forming a data confirmation pattern;

etching said film to leave said film only in said area for forming said data confirmation pattern; and etching said film using a mask to be used or ion implantation for ROM data, to form said data confirmation pattern on the film remaining in the area for forming said data confirmation pattern and leaving said oxide film in said area of memory cells.

2. A manufacturing method for a semiconductor storage device described in claim 1 wherein said area for forming said data confirmation pattern is composed of a field oxide film and said film to be formed over the area for forming the data confirmation pattern is a polycrystal silicon film.

3. A manufacturing method for a semiconductor storage device as described in claim 1 wherein said area for forming said data confirmation pattern is composed of a field oxide film and said film to be formed over the area for forming said data confirmation pattern is a silicon nitride film.

* * * * *